(12) United States Patent  Park

(10) Patent No.: US 6,891,773 B2
(45) Date of Patent: May 10, 2005

(54) DRIVING VOLTAGE CONTROLLER OF SENSE AMPLIFIERS FOR MEMORY DEVICE

(75) Inventor: Jong Hun Park, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/655,204

(22) Filed: Sep. 4, 2003

(65) Prior Publication Data

US 2004/0213063 A1 Oct. 28, 2004

(30) Foreign Application Priority Data

Apr. 23, 2003 (KR) .............................. 10-2003-0025769

(51) Int. Cl.[7] .................................................. G11C 8/00
(52) U.S. Cl. .................. 365/230.06; 365/205; 365/226
(58) Field of Search ................................ 365/205, 226, 365/230.06, 189.07, 189.09, 189.11

(56) References Cited

U.S. PATENT DOCUMENTS 5,689,460 A * 11/1997 Ooishi ................... 365/189.07
5,881,014 A * 3/1999 Ooishi ......................... 365/226
5,943,273 A * 8/1999 Hidaka et al. .......... 365/189.11
6,097,635 A * 8/2000 Chang .................... 365/185.21

* cited by examiner

*Primary Examiner*—Gene N. Auduong
(74) *Attorney, Agent, or Firm*—Ladas & Parry LLP

(57) ABSTRACT

Disclosed is a driving voltage controller of sense amplifiers for a memory device which prevents the sense amplifier from being over-driven when an external power voltage is used for an internal driving voltage of the sense amplifier. Reference voltage generator generates a reference voltage. Core voltage generator generates a core voltage to be used for driving voltage of sense amplifier. Comparator compares the core voltage generated by core voltage generator with the reference voltage generated by reference voltage generator. Clamp adjusts a level of the core voltage generated by the core voltage generator based on an output signal of comparator. In the case where an external power used for a driving voltage of the sense amplifier is excessively high, the comparator compares the external power voltage with the reference voltage. When the driving voltage of sense amplifier exceeds the reference voltage, the clamp drops the driving voltage of sense amplifier. Thus, the core voltage can be stably supplied.

4 Claims, 3 Drawing Sheets

DRIVING VOLTAGE CONTROLLER OF SENSE AMPLIFIERS FOR MEMORY DEVICE

BACKGROUND OF THE INVENTION

1. Field of the Invention

The present invention relates to a driving voltage controller of sense amplifiers for a memory device, and more particularly to a driving voltage controller of sense amplifiers for a memory device which prevents the sense amplifier from being over-driven when an external power voltage is used for an internal driving voltage of the sense amplifier.

2. Description of the Prior Art

As generally known in the art, in order to read out data stored in a memory cell in a memory device such as a dynamic random access memory (referred to as a "DRAM" hereinafter), word lines are enabled and a charge stored in the memory cell is transferred to a true bit line BL and a complementary bit line /BL. A sense amplifier senses and amplifies a minute potential difference between the true bit line BL and the complementary bit line /BL. Then the sense amplifier transits a voltage on the true bit line BL to a high level, and transits a voltage on the complementary bit line /BL to a low level.

As a potential difference between the true bit line BL and the complementary bit line /BL becomes rapidly greater, a data output time through a data output buffer is shortened to allow the memory device to be operated at a high speed. In order to obtain a great potential difference between the true bit line BL and the complementary bit line /BL, it is necessary that a driving voltage of the sense amplifier be maintained in a high level for a predetermined time (namely, during a sensing operation). Conventionally, during the sensing operation, an external supply power is used as a core voltage Vcore which is used for a driving voltage of the sense amplifier. The sensing operation requires a significant power consumption.

FIGS. 1A and 1B are views for illustrating an operation of a conventional sense amplifier in a memory device.

As shown in FIGS. 1A and 1B, after a word line is enabled at a high level, a potential difference between the bit lines occurs. The sense amplifier senses the occurrence of the potential difference between the bit lines and starts a sensing operation. At this time, a sense enable bar signal sense_enb is maintained at a low level for a predetermined time to drive a core voltage driver. The sense enable bar signal sense_enb is a signal which controls a core voltage driver. The core voltage driver turns on a PMOS transistor which functions as a switch for an external voltage supply. Accordingly, a level of the core voltage is increased to a level of an external power voltage. As stated above, the core voltage is used for the driving voltage of the sense amplifier.

FIG. 1B shows a change process of a driving voltage of the sense amplifier, namely, the core voltage Vcore.

A great deal of energy is instantaneously consumed during sensing and amplifying operations between the true and complementary bit lines BL and /BL by the sense amplifier to rapid drop a level of the core voltage which is a driving voltage of the sense amplifier. Although an external power voltage is applied to generate the core voltage by a core voltage driver during the sensing operation, current consumption due to the sensing operation is too great. It does not prevent a rapid reduction of the core voltage.

However, during a predetermined time, namely, while a core voltage driver is enabled, the external power voltage is applied to generate the core voltage which functions as the driving voltage of the sense amplifier. As shown in FIG. 1b, accordingly, the core voltage is rapidly increased to and maintained at a level of the external power voltage.

In this case, when the external power voltage Vext is low (Low Vext; for example, when a standard external power voltage is 2.5 V, a voltage of about 2.1 V is supplied in practice), in order to supply a sufficient voltage to the sense amplifier S/A, a PMOS transistor should have a significant size. The PMOS transistor is a driving transistor which transfers the external power voltage Vext. Accordingly, when the external power voltage is high (High Vext; for example, when a standard external power voltage is 2.5 V, a voltage of about 4 V is supplied in practice), the core voltage is increased to an excessively high level (FIG. 1B). Such a case produces problems as follows.

First, when the core voltage is increased beyond a threshold value thereof, a sensing current of the sense amplifier is increased and causes a unnecessary power consumption to occur.

Second, the core voltage is also used for a bit line precharge voltage. Accordingly, when the level of the core is too high, the level of the bit line precharge voltage is relatively high. Thus, an unexpected erroneous operation occurs during operation of the sense amplifier.

SUMMARY OF THE INVENTION

Accordingly, the present invention has been made to solve the above-mentioned problems occurring in the prior art, and an object of the present invention is to provide a driving voltage controller of sense amplifiers for a memory device, which can prevent unnecessary power consumption in the sense amplifier and can relatively stabilize a bit line precharge voltage by clamping an external power voltage at a predetermined level when an external power voltage significantly greater than a standard external power voltage is supplied.

In accordance with the present invention, there is provided an apparatus for controlling a driving voltage of sense amplifiers for a memory device, the apparatus comprising: a reference voltage generator for generating a reference voltage; a core voltage generator for generating a core voltage to be used for the driving voltage of the sense amplifier; a comparator for comparing the core voltage generated by the core voltage generator with the reference voltage generated by the reference voltage generator; and a clamp for adjusting a level of the core voltage generated by the core voltage generator based on an output signal of the comparator.

Preferably, the comparator drives the clamp to discharge a charge of the core voltage to a ground line when the core voltage is greater than the reference voltage, and the comparator controls the clamp to be maintained in a non-drive state when the core voltage is less than the reference voltage.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1A:
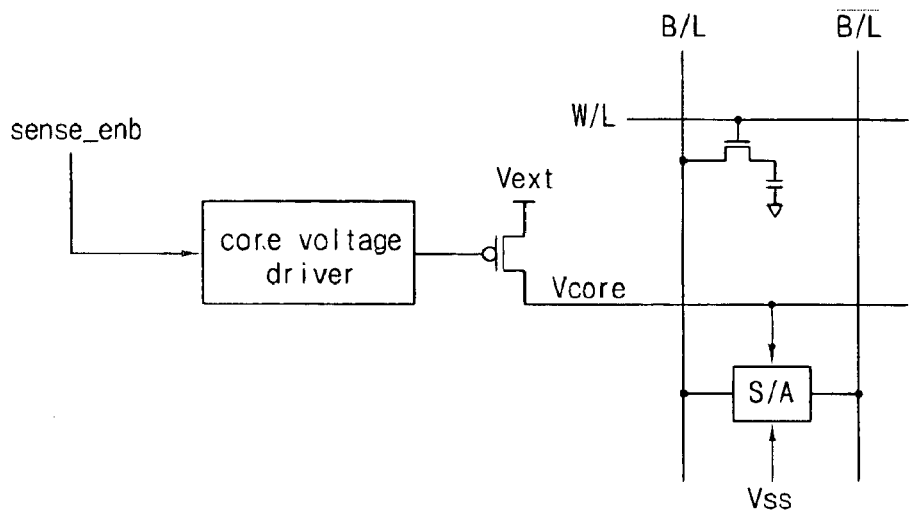
FIGS. 1A and 1B are views for illustrating an operation of a conventional sense amplifier in a memory device.
Figure 1B:
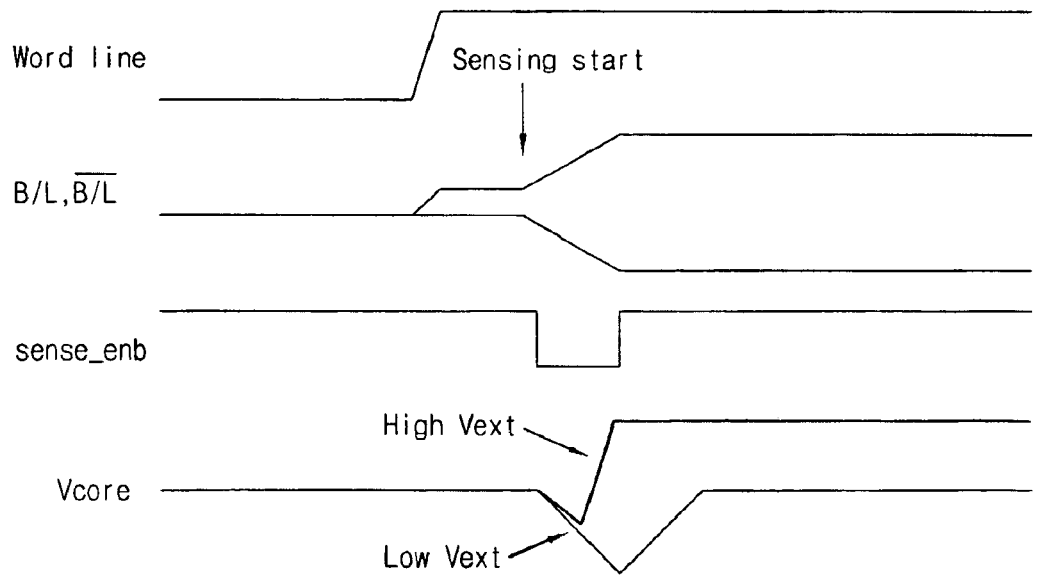
Figure 2:
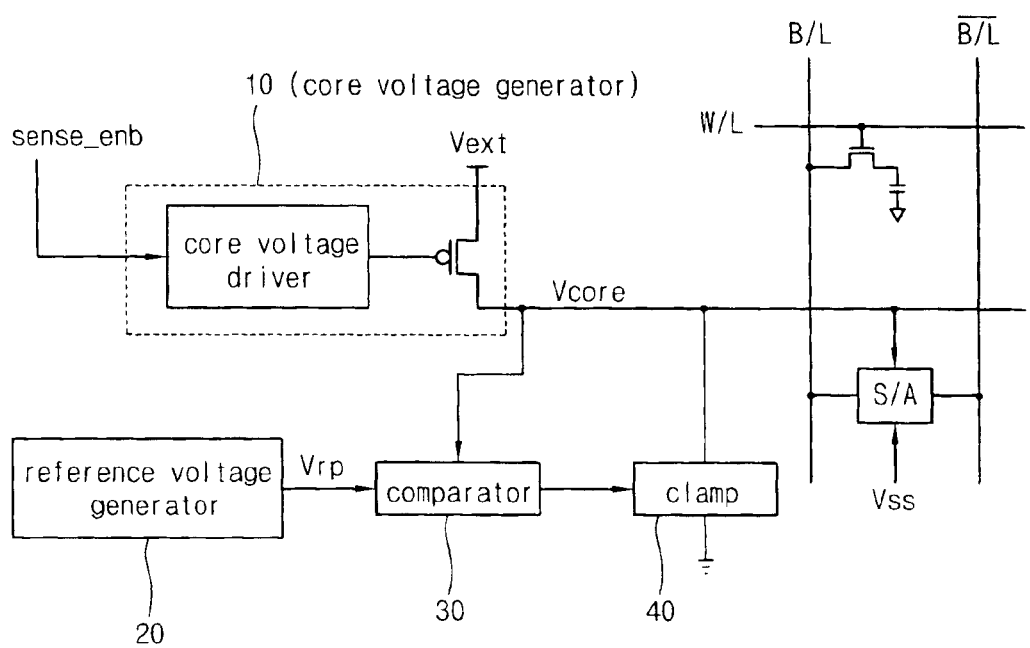
FIG. 2 is a block diagram showing a configuration of a driving voltage controller of sense amplifiers for a memory device according to an embodiment of the present invention.

FIG. 2 is a block diagram showing a configuration of a driving voltage controller of sense amplifiers for a memory device according to an embodiment of the present invention.

As shown in FIG. 2, the apparatus for controlling a driving voltage of sense amplifiers for a memory device includes a reference voltage generator 20, a core voltage generator 10, a comparator 30, and a clamp 40.

The reference voltage generator 10 generates a reference voltage Vrp. The core voltage generator generates a core voltage Vcore to be used for the driving voltage of the sense amplifier. The comparator 30 compares the core voltage Vrp generated by the core voltage generator 10 with the reference voltage Vrp generated by the reference voltage generator 20. The clamp 40 adjusts a level of the core voltage generated by the core voltage generator 10 based on an output signal of the comparator 40.

The core voltage generator includes a core voltage driver and a switch. The switch includes a PMOS transistor.

The core voltage driver is driven by the sense enable bar signal sense_enb.

The PMOS transistor is driven by an output signal of the core voltage driver. When an output of the core voltage driver is a low level, the PMOS transistor is turned on, the external power voltage Vext is supplied to generate the driving voltage, that is, a core voltage of the sense amplifier S/A.

The reference voltage generator 20 is a device which generates a reference voltage Vrp greater than the core voltage Vcore. Embodiment and modifications of the reference voltage generator 20 will be apparent to a person having ordinary skill in the art, and therefore details thereof will be omitted.

The comparator 30 is a means for comparing the core voltage Vrp generated by the core voltage generator 10 with the reference voltage Vrp generated by the reference voltage generator 20. Embodiment and modifications of the comparator 30 will be apparent to a person having ordinary skill in the art as in the reference voltage generator, and therefore a detailed circuit thereof will be omitted.

The clamp 40 is means which adjusts a level of the core voltage generated by the core voltage generator 10 based on an output signal of the comparator 40.

Figure 3:
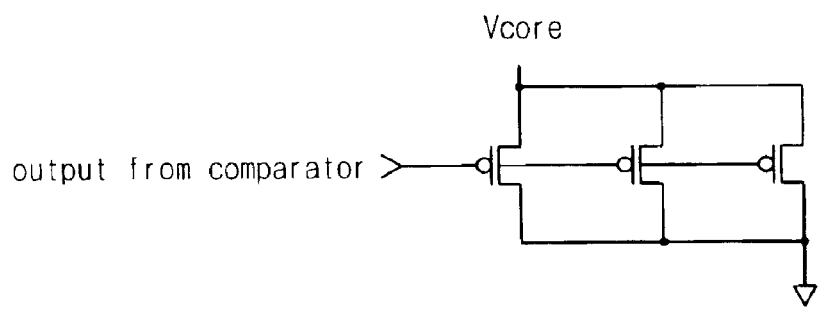
FIG. 3 is a circuit diagram showing an example of a clamp employed in the driving voltage controller shown in FIG. 2.

The operation of the driving voltage controller of sense amplifiers for a memory device according to an embodiment of the present invention will now be explained with reference to FIG. 3. FIG. 3 is a circuit diagram showing an example of a clamp 40 shown in FIG. 2.

As shown in FIG. 3, the clamp 40 includes a MOS transistor which is connected between a core voltage and a ground voltage. If necessary, the MOS transistor includes a plurality of transistors which are connected to each other in parallel. A plurality of the transistors are selectively used. In FIG. 3, PMOS transistors are used to embody the clamp 40. However, NMOS transistors are used to embody the clamp 40.

In the operation, when the core voltage is greater than the reference voltage, the comparator 30 outputs a low level voltage to a driver formed by PMOS transistors so that the clamp 40 drops the core voltage. When the core voltage is less than the reference voltage, the comparator 30 outputs a high level voltage to a driver formed by PMOS transistors so that the clamp 40 drops the core voltage.

Figure 4:
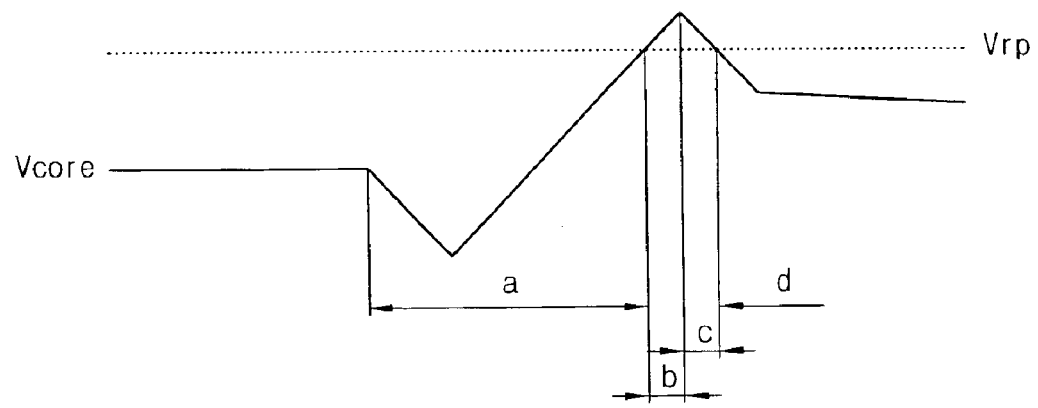
FIG. 4 is a view illustrating a change process of a core voltage according the embodiment of the present invention.

FIG. 4 is a view illustrating a change process of a core voltage according the embodiment of the present invention when an external power voltage is high.

As shown in FIG. 4, in a case where an external power voltage (for example, 4 V) having a level significantly greater than a standard external power voltage Vexp (for example, 2.5 V) is applied, when a sensing operation of a sensing amplifier starts, during a period (a), an operation of a driving voltage controller of sense amplifiers for a memory device is identical with that of a conventional core voltage generator. That is, the reason is that the clamp 40 is not operated since a core voltage is lower than a reference voltage during the period (a). However, when the core voltage exceeds the reference voltage, the clamp 40 is turned on to down a level of the core voltage. In FIG. 4, during a period (b), the core voltage is significantly influenced by the external power supply for a short time in spite of an operation of the clamp 40. During a period (d), the core voltage is substantially influenced by the external power supply for a short time in spite of an operation of the clamp 40 to drop the level of the core voltage. After the period (c), since the sensing operation of the sense amplifier is unnecessary, the core voltage generator 10 is disabled. During the periods (c) and (d), a sense enable signal sense_enb is transited to a high level to turn off a PMOS transistor of the core voltage generator 10. The sense enable signal sense_enb is a signal which controls the core voltage driver shown in FIG. 2. When the PMOS transistor is turned off and the external power voltage is not supplied, the driving voltage of the sense amplifier has a predetermined value as during the period (d). Details thereof will be now described. In a state that the external power voltage is not supplied through the PMOS transistor, since the core voltage Vcore applied to the comparator 30 during the period (c) is greater than the reference voltage Vrp, the clamp 40 is turned on to drop the core voltage Vcore. On the contrary, since the core voltage Vcore applied to the comparator 30 during the period (d) is less than the reference voltage Vrp, the clamp 40 is turned off. In this case, a core voltage line connected to the sense amplifier has a predetermined potential level by electric charge of parasitic capacitance stored therein. However, as time goes by, the potential level of the core voltage line drops by degrees.

As mentioned above, the conventional core voltage generator does not means for intercepting an increased core voltage when a core voltage is increased beyond a threshold value. On the contrary, according to the present invention, during an operation of the sense amplifier, in a case where an external power used for a driving voltage of the sense amplifier is significantly high, the comparator compares the external power voltage with the reference voltage. When the driving voltage of the sense amplifier exceeds the reference voltage, the clamp drops the driving voltage of the sense amplifier. Thus, it provides a stabilized core voltage.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for controlling a driving voltage of sense amplifiers for a memory device, the apparatus comprising:

a reference voltage generator for generating a reference voltage;

a core voltage generator for generating a core voltage to be used directly for the driving voltage of the sense amplifier;

a comparator for comparing the core voltage generated by the core voltage generator with the reference voltage generated by the reference voltage generator; and a clamp connected between the core voltage and a ground voltage for adjusting a level of the core voltage generated by the core voltage generator based on an output signal of the comparator.

2. The apparatus according to claim 1, wherein the comparator drives the clamp to discharge a charge of the core voltage to a ground line when the core voltage is greater than the reference voltage, and the comparator controls the clamp to be maintained in a non-drive state when the core voltage is less than the reference voltage.

3. The apparatus according to claim 1, wherein the core voltage generated by the core voltage generator includes a sense enable bar signal which is an inverted signal of an enable signal, and the enable signal is a signal which enables a sensing operation of the sense amplifier.

4. The apparatus according to claim 3, wherein the core voltage generator includes:

a core voltage driver driven by the sense enable bar signal; and a switch being driven by an output signal of the core voltage driver, wherein, when the switch is turned on, an external power voltage supplied to the memory device is used to generate the core voltage of the sense amplifier.

* * * * *